(12) United States Patent
Kim

(10) Patent No.: US 12,146,921 B2
(45) Date of Patent: Nov. 19, 2024

(54) CELL INSULATION DEFECT DETECTION SYSTEM

(71) Applicants: Hyundai Motor Company, Seoul (KR); Kia Corporation, Seoul (KR)

(72) Inventor: Kyung Mo Kim, Gyeonggi-do (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 128 days.

(21) Appl. No.: 17/983,043

(22) Filed: Nov. 8, 2022

(65) Prior Publication Data

US 2023/0145111 A1 May 11, 2023

(30) Foreign Application Priority Data

Nov. 8, 2021 (KR) .......................... 10-2021-0152313

(51) Int. Cl.
*G01R 31/396* (2019.01)
*G01R 31/36* (2020.01)
*G01R 31/392* (2019.01)

(52) U.S. Cl.
CPC ....... *G01R 31/396* (2019.01); *G01R 31/3644* (2013.01); *G01R 31/392* (2019.01)

(58) Field of Classification Search
None
See application file for complete search history.

(56) References Cited

U.S. PATENT DOCUMENTS

2022/0416286 A1* 12/2022 Park ................... H01M 10/0422
2023/0142533 A1* 5/2023 Taniguchi .............. G01R 31/16
324/551

FOREIGN PATENT DOCUMENTS

| CN | 203481323 U | 3/2014 |
|---|---|---|
| JP | H06338351 A | 12/1994 |
| KR | 1998-0035750 A | 8/1998 |
| KR | 100190700 B1 | 6/1999 |
| KR | 2011-0018081 A | 2/2011 |
| KR | 101180830 B1 | 9/2012 |
| KR | 2013-0009232 A | 1/2013 |
| WO | 2018-094916 A1 | 5/2018 |

* cited by examiner

*Primary Examiner* — Jas A Sanghera
(74) *Attorney, Agent, or Firm* — Fox Rothschild LLP

(57) ABSTRACT

The present disclosure relates to a battery cell, and more particularly, to a cell insulation defect detection system configured to detect insulation defects of individual cells forming a battery. The cell insulation defect detection system of the present disclosure comprises a contact unit comprising a conductive roller configured to contact a battery cell to be inspected, the battery cell being rotatably housed therein, and a measurement unit configured to measure insulation resistance between the roller and the cell in contact with each other.

17 Claims, 19 Drawing Sheets

CELL INSULATION DEFECT DETECTION SYSTEM

CROSS-REFERENCE TO RELATED APPLICATION(S)

This application claims, under 35 U.S.C. § 119(a) the benefit of Korean Patent Application No. 10-2021-0152313, filed on Nov. 8, 2021, the disclosure of which is incorporated herein by reference in its entirety.

BACKGROUND

Technical Field

Embodiments of the present disclosure relate to a battery cell and, more particularly, to a cell insulation defect detection system configured to detect insulation defects of individual cells forming a battery.

Background

Eco-friendly vehicles, such as electric vehicles, hybrid electric vehicles, and fuel cell vehicles, partially or entirely receive driving force from a motor. Recently, these eco-friendly vehicles have drawn a great deal of attention.

The motor is driven by receiving energy stored in a battery provided in a vehicle. Particularly, a battery module or a battery pack comprising a plurality of unit cells electrically connected to each other is applied to a machine requiring high output and large capacity, such as the vehicle. Specifically, the battery module is made by a plurality of unit cells, and the battery pack is obtained by assembling several battery modules.

A certain number of unit cells are joined to each other to produce a module with a target capacity where each cell is inserted into a cell housing to be fixed therein. In addition, as shown in FIG. 1, each cell 10 may comprise a side surface insulated by a tubing 12 to be insulated from adjacent cells.

The above information disclosed in this Background section is only for enhancement of understanding of the background of the present disclosure and therefore it may contain information that does not form the existing technologies that is already known in this country to a person of ordinary skill in the art.

SUMMARY

The present disclosure has been made in an effort to solve the above-described problems associated with existing technologies, and it is an object of the present disclosure to provide a cell insulation defect detection system capable of detecting insulation defects of individual cells in advance.

The object of the present disclosure is not limited to the above-mentioned object, and other objects not yet mentioned will be clearly understood by those of ordinary skill in the art to which the present disclosure pertains from the following descriptions (hereinafter referred to as "those skilled in the art").

In order to achieve the object of the present disclosure as described above and to perform the characteristic functions of the present disclosure to be described later, the characteristics of the present disclosure are described as follows.

In one aspect, the present disclosure provides a cell insulation defect detection system including a contact unit including a conductive roller to contact a battery cell to be inspected, the battery cell being rotatably housed therein, and a measurement unit configured to measure insulation resistance between the roller and the cell in contact with each other.

Other aspects and preferred embodiments of the disclosure are discussed infra.

The above and other features of the disclosure are discussed infra.

BRIEF DESCRIPTION OF THE DRAWINGS

The above and other features of the present disclosure will now be described in detail with reference to certain exemplary embodiments thereof illustrated in the accompanying drawings which are given hereinbelow by way of illustration only, and thus are not limitative of the present disclosure, and wherein.

Figure 1:
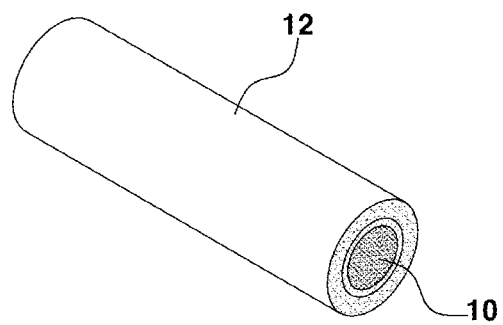
FIG. 1 shows an example of an individual cell forming a battery module or a battery pack.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. These terms are merely intended to distinguish one component from another component, and the terms do not limit the nature, sequence or order of the constituent components. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

Specific structural or functional descriptions in the embodiments of the present disclosure are merely illustrative for the purpose of describing embodiments according to the concept of the present disclosure, and the embodiments according to the concept of the present disclosure may be implemented in various forms. Further, it will be understood that the present description is not intended to limit the disclosure to those embodiments. On the contrary, the disclosure is intended to cover not only the embodiments, but also various alternatives, modifications, equivalents and other embodiments, which may be included within the spirit and scope of the disclosure as defined by the appended claims.

Meanwhile, in the present disclosure, terms such as first and/or second may be used to describe various components, but the components are not limited to the terms. The terms are used only for the purpose of distinguishing one component from other components. For example, a first component may be referred as a second component, and similarly, the second component may also be referred to as the first component within the scope not departing from the scope of rights according to the concept of the present disclosure.

When one component is referred to as being "connected" or "joined" to the other component, the one component may be directly connected or joined to the other component, but it should be understood that other components may exist therebetween. On the other hand, when the one component is referred to as being "directly connected to" or "directly in contact with" the other component, it should be understood that other components do not exist therebetween. Other expressions for the description of a relationship between components, that is, "between" and "directly between" or "adjacent to" and "directly adjacent to," should be interpreted in the same manner.

The same reference numerals represent the same components throughout the specification. On the other hand, the terms in the specification are used to describe embodiments and are not intended to limit the present disclosure. In this specification, an expression in a singular form also includes a plural form unless otherwise clearly specified in the phrase. As used herein, expressions such as "comprise" and/or "comprising" do not exclude the presence or addition of one or more other components, steps, operations, and/or elements other than those described.

Hereinafter, some embodiments of the present disclosure will be described in detail with reference to the exemplary drawings. In the drawings, the same reference numerals will be used throughout to designate the same or equivalent elements. In addition, a detailed description of well-known features or functions will be ruled out in order not to unnecessarily obscure the gist of the present disclosure.

As described above, a module includes a plurality of unit cells connected to each other, and a plurality of modules are assembled to form a battery pack.

In a battery module assembly process, insulating capability of the cell may be destroyed by several factors, such as foreign metal materials or other jig burrs. Therefore, an insulation resistance test is usually performed on the assembled module before the module is made into the battery.

Figure 2:
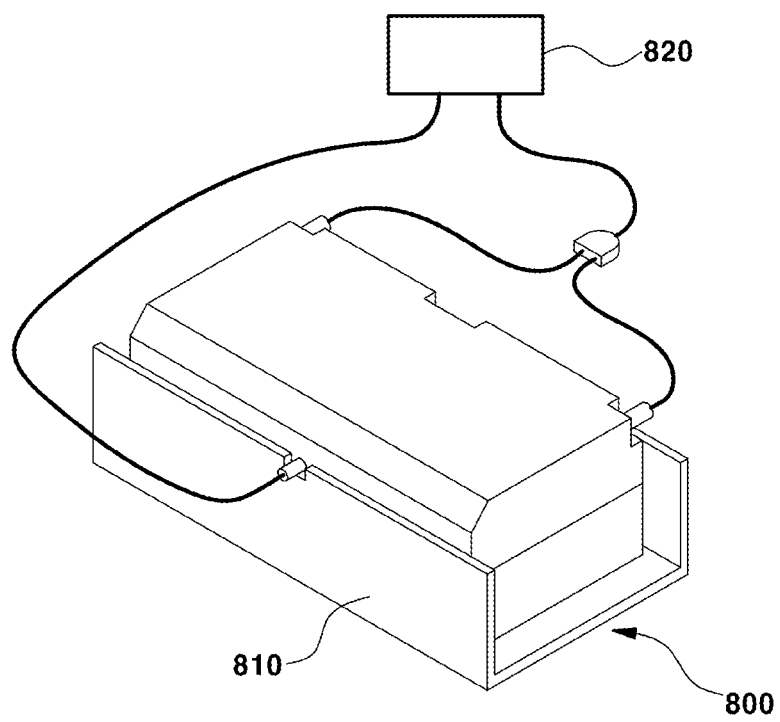
FIG. 2 is a schematic view of an insulation test for an enclosure of the battery module.

As shown in FIG. 2, in general, the insulation resistance test is performed using an enclosure (for example, a metal enclosure) of a battery module 800. An inspection jig 810 surrounding the enclosure of the battery module 800 is manufactured, and an insulation resistance measuring device 820 checks whether the battery module 800 has an insulation defect.

Figure 3:
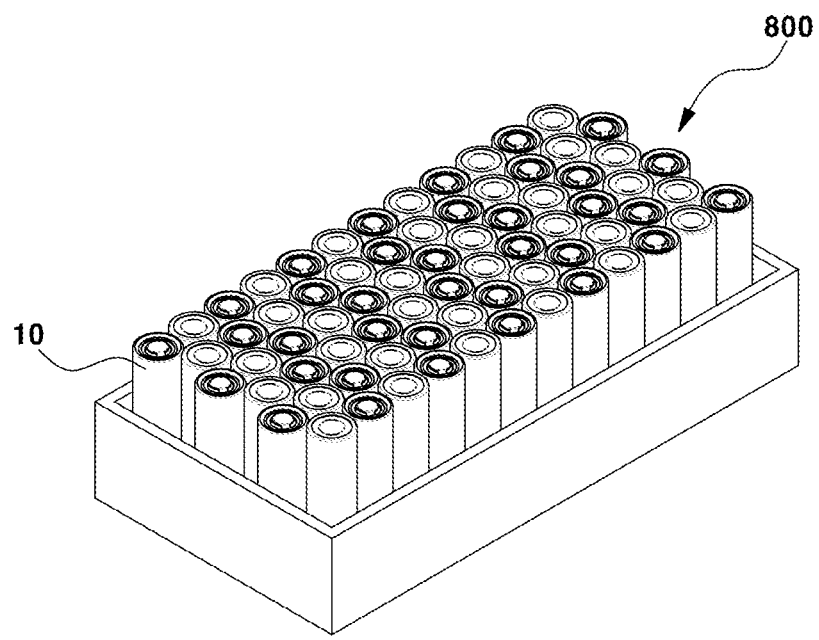
FIG. 3 shows an internal state of the battery module including a plurality of cells connected to each other.

However, when the tubing 12 of the cell 10 forming the module is damaged and insulation is broken, this type of insulation defect may not be identified by this enclosure inspection method, yet an insulation problem may appear as a field issue. As shown in FIG. 3, since a plurality of cells 10 are connected in series in the module and a gap between the cells adjacent to each other is narrow by about 1 to 2 mm, insulation performance may get worsen when a defect occurs in the tubing 12 of the cell 10.

If the insulation defects of individual cells can be identified in advance, costs may be significantly reduced compared to disposal costs incurred due to poor insulation performance detected after the assembly of a module or a pack. Further, it is possible to prevent an insulation problem which may occur in the field.

An object of the present disclosure is to provide a highly reliable cell insulation defect detection system capable of detecting a cell insulation defect in an individual cell state prior to the assembly of a battery module. Specifically, according to the present disclosure, an insulation resistance test is performed where a conductive rubber is contacted with a cell tubing surface prior to assembly of the battery module. Here, provided is a contact unit to which a rotation pressurization method is applied, the rotation pressurization method being used for the conductive rubber to approach and contact the cell tubing. The present disclosure allows the conductive rubber to make rolling contact with the tubing surrounding an outside of the cell, thereby performing insulation inspection on a peeled portion of the cell tubing prior to module or cover assembly.

Figure 4:
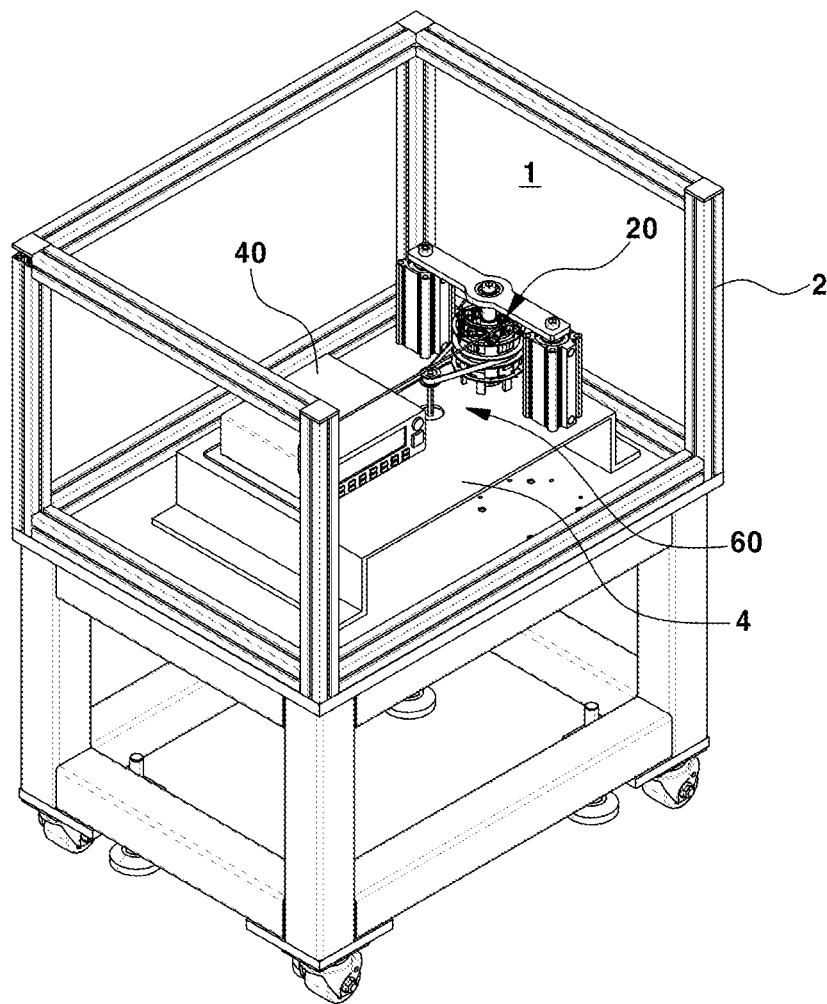
FIG. 4 shows a cell insulation defect detection system according to an exemplary embodiment of the present disclosure.
Figure 5:
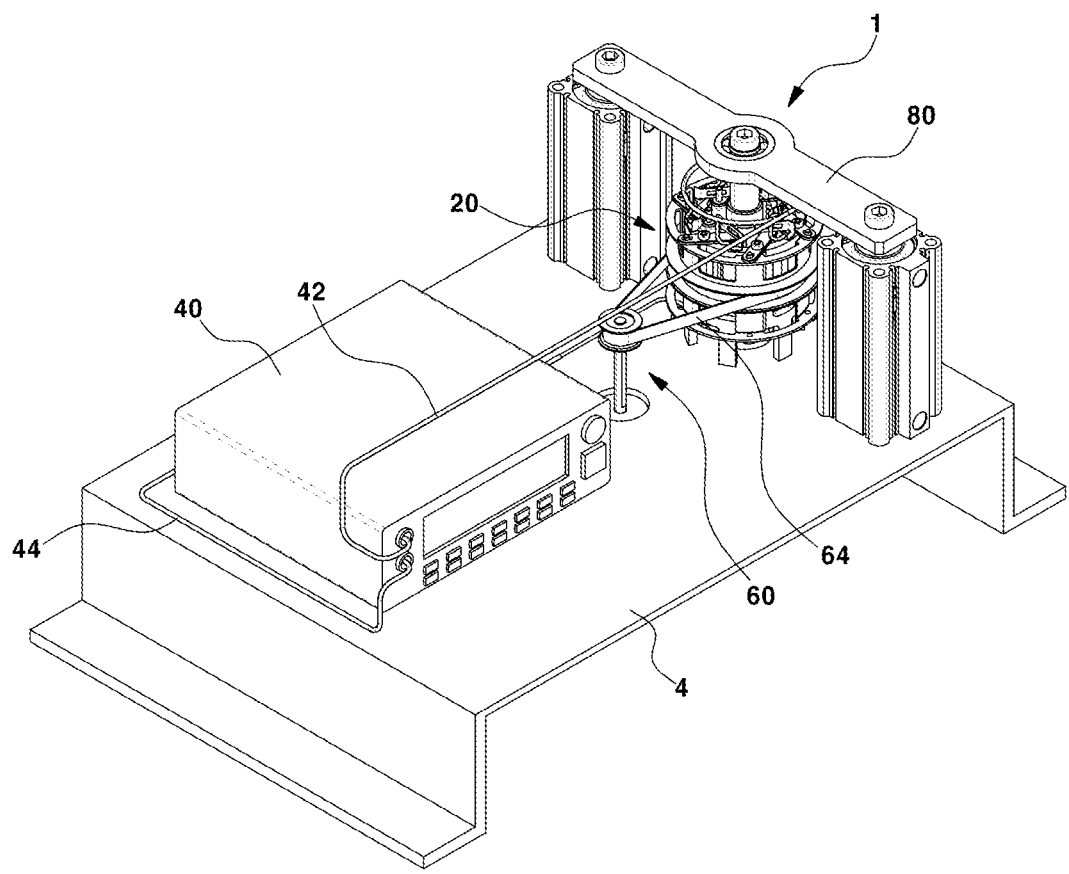
FIG. 5 is a partially enlarged view of FIG. 4.
Figure 6:
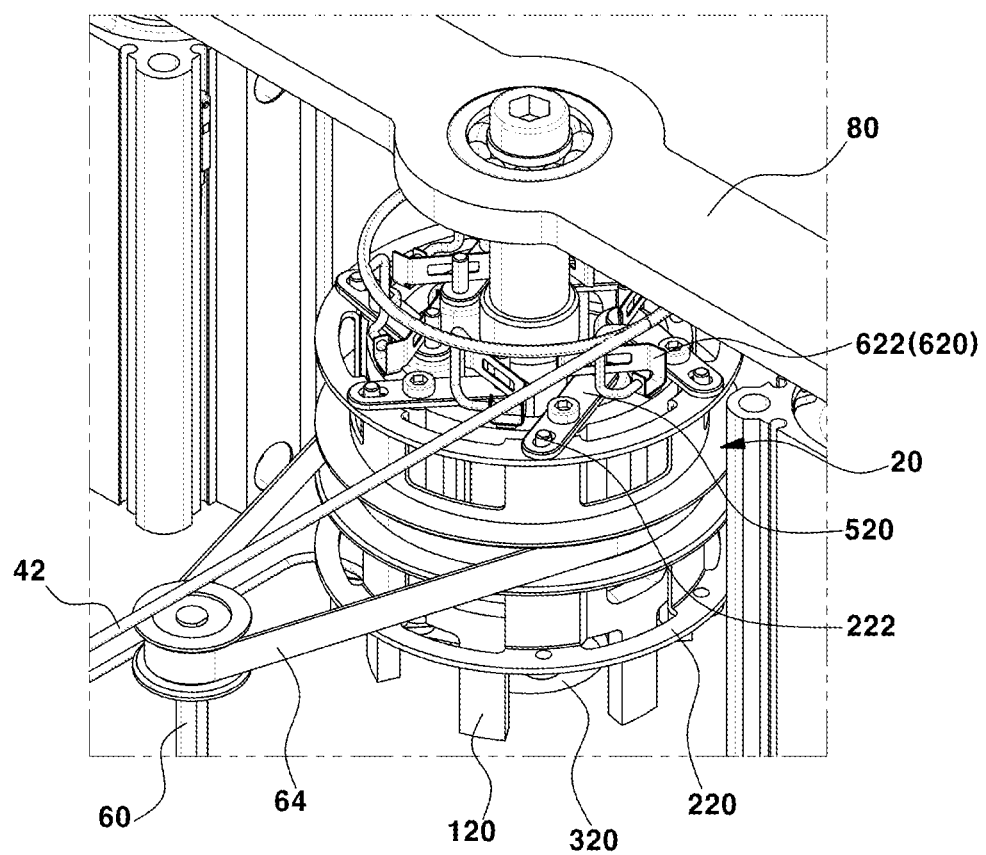
FIG. 6 is a partially enlarged view of FIG. 5.

As shown in FIGS. 4 to 6, a cell insulation defect detection system 1 according to an exemplary embodiment of the present disclosure may be installed on a support 2. A base 4 may be provided on the support 2, and a contact unit 20 and a measurement unit 40 may be disposed on the base 4.

The contact unit 20 is disposed on one side of the base 4, and the measurement unit 40 is disposed on the other side of the base 4 to be spaced apart from the contact unit 20 at a predetermined distance. The rotation unit 60 is disposed at a position spaced apart from the contact unit 20 at a predetermined distance. According to an exemplary embodiment, the rotation unit 60 may be disposed between the contact unit 20 and the measurement unit 40. According to another embodiment, the contact unit 20 may be disposed between the rotation unit 60 and the measurement unit 40. According to the present disclosure, the contact unit 20, the measurement unit 40, and the rotation unit 60 may be disposed in various ways.

The contact unit 20 includes a fixed frame 120 and a rotation frame 220. The fixed frame 120 is a non-movable part and may be supported by the base 4. The rotation frame 220 is disposed coaxially with the fixed frame 120 and is disposed at an outside of the fixed frame 120 to surround the fixed frame 120. The rotation frame 220 is disposed at the outside of the fixed frame 120 to be rotatable at least at a predetermined angle with respect to the fixed frame 120. The rotation frame 220 is configured to be rotatable bidirectionally with respect to the fixed frame 120, that is, clockwise or counterclockwise. According to an exemplary embodiment, a predetermined distance may be provided between the fixed frame 120 and the rotation frame 220 for the rotation of the rotation frame 220.

Figure 7A:
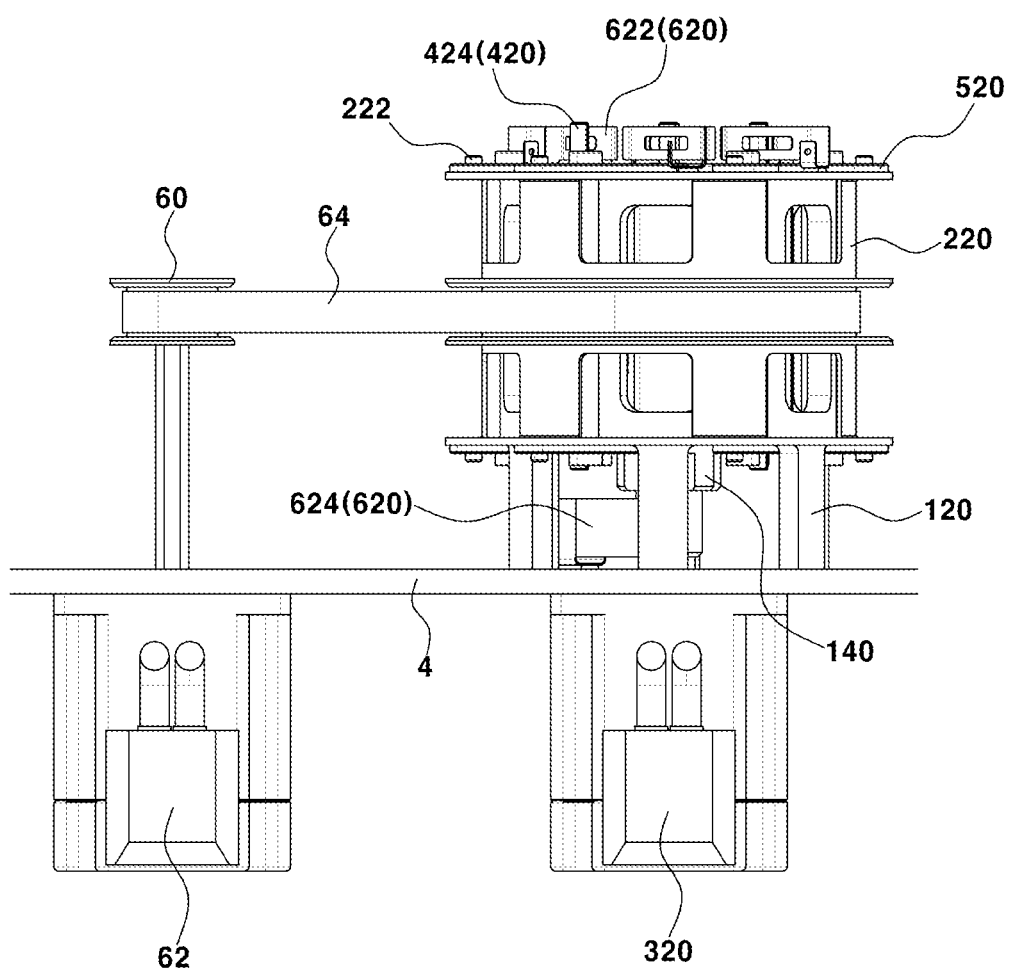
FIG. 7A is a front view of FIG. 6.
Figure 7B:
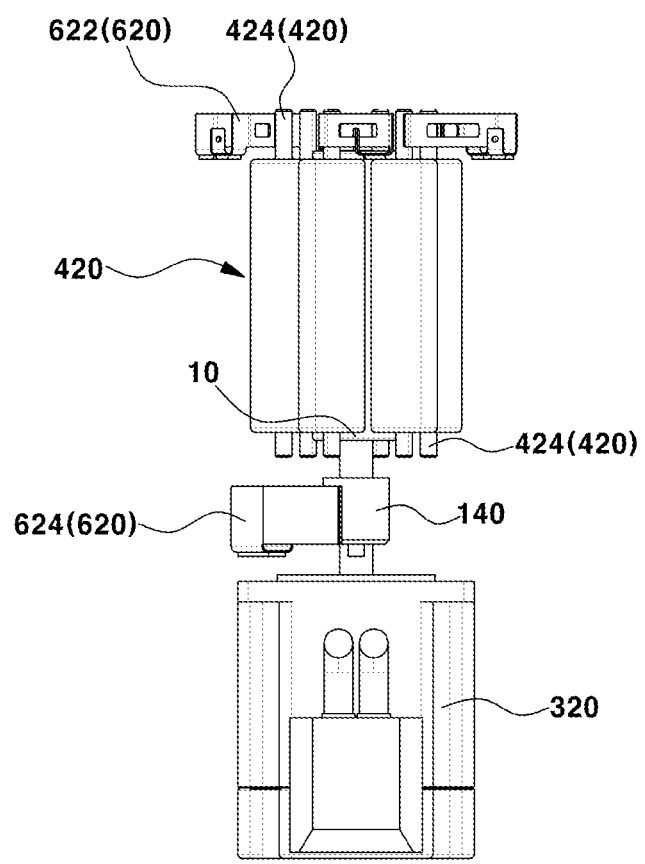
FIG. 7B is a partial excerpt of a contact unit.

As shown in FIGS. 7A and 7B, the mounting unit 140 is provided at the center of the contact unit 20. The mounting unit 140 is disposed inside of the fixed frame 120 or the rotation frame 220. More specifically, the mounting unit 140 may be disposed at the center of the fixed frame 120 or the rotation frame 220, and the cell 10 to be inspected may be disposed at the mounting unit 140. The cell 10 includes the tubing 12 for insulation, and the tubing 12 surrounds an outer circumferential surface of the cell 10. The cell 10 is preferably cylindrical. However, the cell 10 may comprise other shapes, such as a square column, an elliptical column, and the like.

The mounting unit 140 is configured to be rotatable within the contact unit 20. The mounting unit 140 is disposed in the contact unit 20 to be rotatable by a driving unit. As a non-limiting example, the driving unit may be a motor. According to an exemplary embodiment of the present disclosure, the cell 10 may be configured to receive rotational force from a mounting motor 320 disposed below the base 4. The mounting unit motor 320 is mounted to rotate the mounting unit 140, and a terminal of the cell 10 is in close contact with the mounting unit 140 and placed thereon.

The mounting unit 140 is configured to allow the conduction of electricity. As will be described later, the mounting unit 140 functions as a detecting terminal of one electrode of the cell 10 to be inspected.

Figure 8:
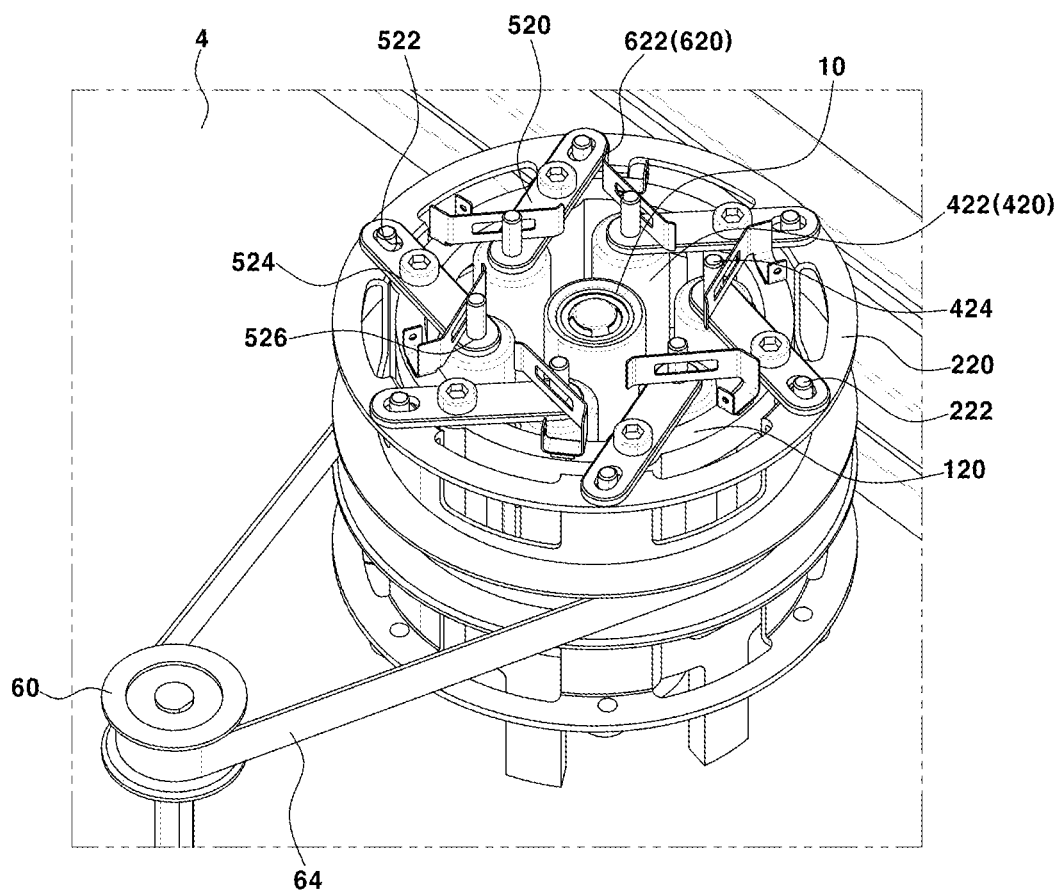
FIG. 8 shows a state of the contact unit before the insulation test is performed.
Figure 9:
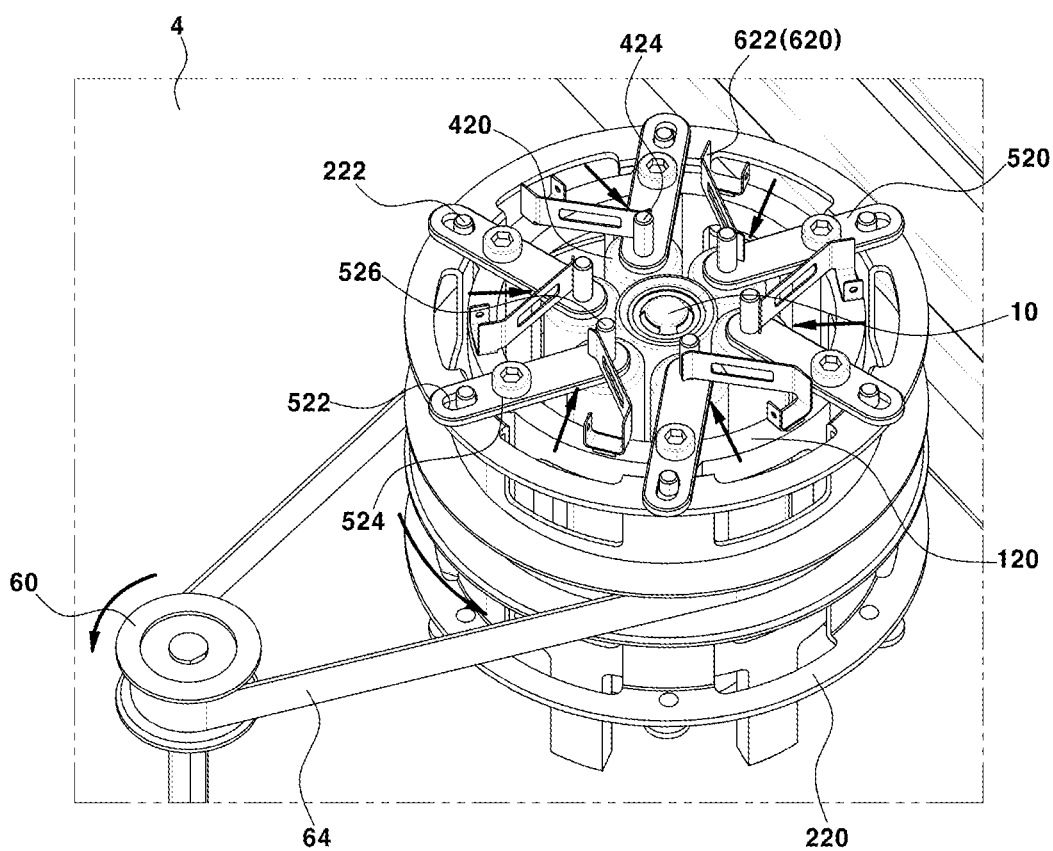
FIG. 9 shows a state of the contact unit when the insulation test is performed.
Figure 10:
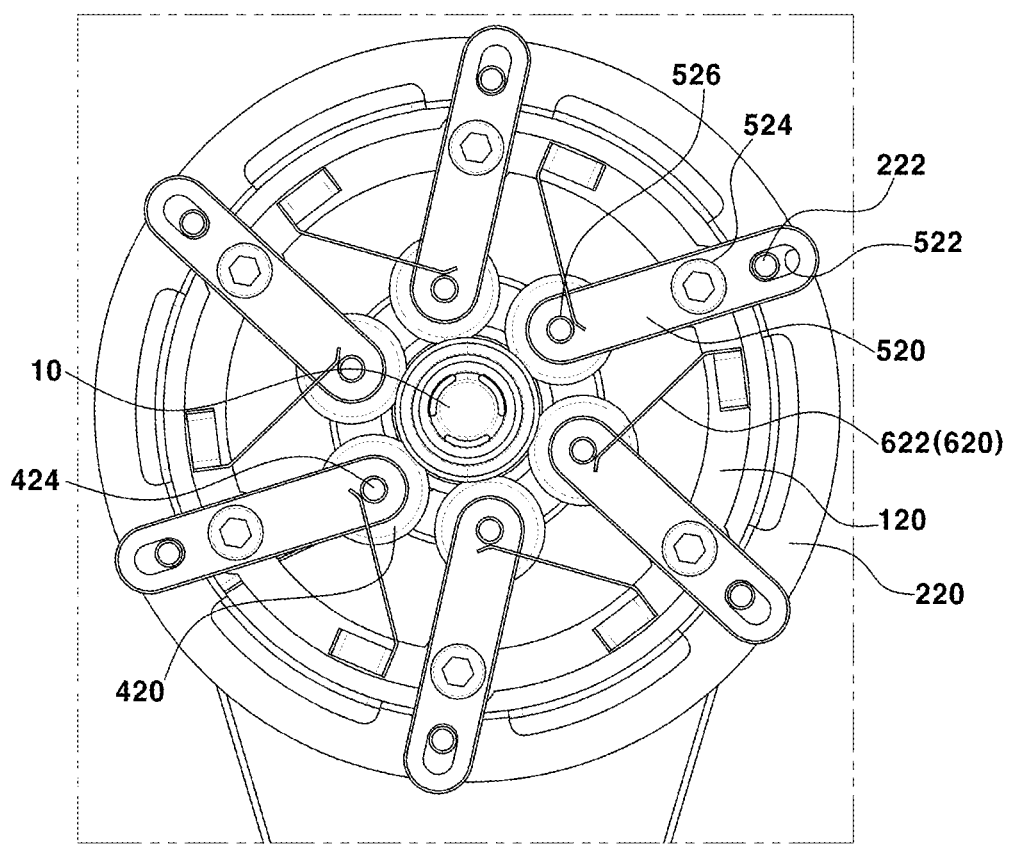
FIG. 10 is a plan view of FIG. 9.

Referring to FIGS. 8 to 10, one or more rollers 420 are disposed around the mounting unit 140 in the contact unit 20. According to an exemplary embodiment of the present disclosure, the rollers 420 are disposed at a predetermined distance along an inner surface of the fixed frame 120 and are configured to be movable at least a certain distance inside of the fixed frame 120 so as to cause the roller(s) 420 to contact the cell 10 or cease the contact with the cell 10. As will be described later, one roller 420 may be configured to determine the insulation defect of the cell 10 rotated by the mounting unit 140 in the contact unit 20, but as the number of rollers 420 increases, the accuracy of inspection may increase.

According to an exemplary embodiment of the present disclosure, the roller 420 is provided in a cylindrical shape. However, as long as the roller 420 can contact the cell 10, depending on a shape of the cell 10, the roller 420 may be provided in a different shape. The roller 420 includes a sleeve 422 mounted therearound and a roller terminal 424 extending in a longitudinal direction of the roller 420. The sleeve 422 is preferably made of a conductive material and may be a conductive rubber. The roller terminals 424 may protrude from opposing ends of the sleeve 422.

A plurality of links 520 connecting the fixed frame 120, the rotation frame 220, and the roller 420 are provided. In an exemplary embodiment, the link 520 may be disposed at each roller terminal 424 with respect to one roller 420. In an exemplary embodiment, the number of the link 520 may correspond to the number of rollers 420.

Opposite sides of the link 520 are connected to the roller 420 and the rotation frame 220, respectively. The fixed frame 120 is connected between the opposite sides of the link 520. According to an exemplary embodiment of the present disclosure, the link 520 includes an outer connection part 522, a pivot part 524, and an inner connection part 526.

The inner connection part 526 of the link 520 is provided on one side of the link 520. The inner connection part 526 is connected to the roller 420. Particularly, the roller terminal 424 of the roller 420 may be inserted into the inner connection part 526, and the inner connection part 526 may be supported by a surface of the roller 420.

The outer connection part 522 is provided on an opposite side of the inner connection part 526. The outer connection part 522 is connected to the rotation frame 220 or placed thereon. According to an exemplary embodiment, the rotation frame 220 includes a plurality of pin members 222 provided thereon. The pin members 222 are disposed to be spaced apart from each other at a predetermined distance along the circumference of the rotation frame 220. In an exemplary embodiment, the outer connection part 522 may be inserted into the pin member 222. The outer connection part 522 is formed to be larger than a diameter/cross-section or size of the pin member 222, and the pin member 222 is configured to be movable within the outer connection part 522.

The link 520 is coupled to the fixed frame 120 by the pivot part 524. The pivot part 524 is provided between the inner connection part 526 and the outer connection part 522, and the link 520 is configured to be rotatable around the pivot part 524. According to an exemplary embodiment, the pivot part 524 is arranged at a center portion of the link 520. According to another embodiment, the pivot part 524 is provided at a location closer to the outer connection part 522 than the central portion of the link 520. In addition, in still another embodiment, the pivot part 524 is provided at a location closer to the inner connection part 526 than the central portion of the link 520.

According to some embodiments of the present disclosure, an extension terminal 620 is further provided. The extension terminal 620 may further comprise a roller extension terminal 622 and a cell extension terminal 624. Here, the roller extension terminal 622 and the cell extension terminal 624 may have the same shape or may have different shapes. Different terms are being used for the roller extension terminal 622 and the cell extension terminal 624 to indicate that the roller extension terminal 622 is a terminal connected to the roller 420 and that the cell extension terminal 624 is a terminal connected to the mounting unit 140 or the cell 10.

The roller extension terminal 622 may be connected to the roller terminal 424 and extend outwards in a radial direction of the contact unit 20. For example, one side of the roller extension terminal 622 may be in contact with the roller terminal 424, and the other side of the roller extension terminal 622 may be placed on the fixed frame 120. Particularly, the presence of the roller extension terminal 622 may facilitate measurement such as when the roller extension terminal 622 is connected to the measurement unit 40.

The cell extension terminal 624 may be connected to the cell 10 or the mounting unit 140. The cell extension terminal 624 is disposed to extend radially outward from the side of the mounting unit 140. The cell extension terminal 624 also improves convenience in measurement, similarly to the roller extension terminal 622.

Referring back to FIG. 7A, the rotation unit 60 provides rotational force to the rotation frame 220. The rotation unit 60 is disposed on the base 4 to be rotatable by a driving unit. In an exemplary embodiment, the rotation unit 60 is configured to be rotatable by a rotation unit motor 62 installed below the base 4.

The rotation unit 60 and the rotation frame 220 are connected to each other by a belt 64. The belt 64 is disposed to surround the rotation unit 60 and the rotation frame 220. Accordingly, when the rotation unit 60 rotates, the rotation frame 220 is configured to rotate together therewith.

Figure 11:
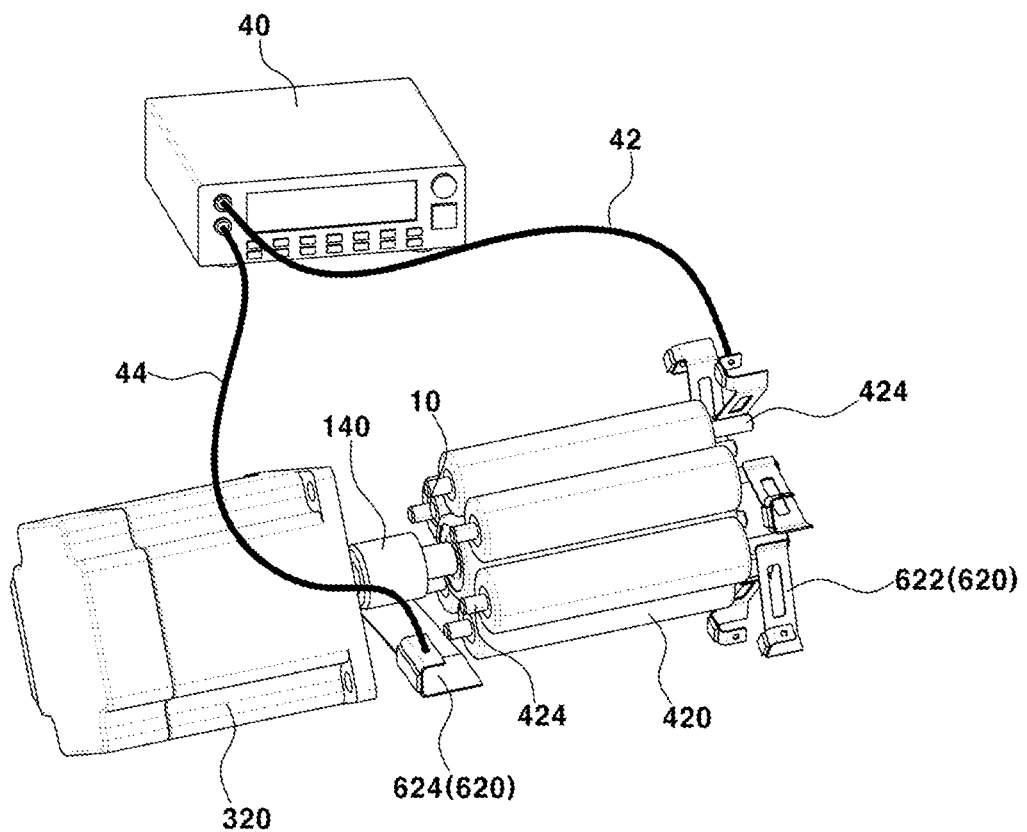
FIG. 11 is a schematic view of the insulation test performed according to the present disclosure.

Referring to FIG. 11, the measurement unit 40 is configured to perform the insulation test. Specifically, the measurement unit 40 is configured to measure an insulation resistance value in a circuit set up by the roller 420 and the cell 10. The roller terminal 424 or the roller extension terminal 622 is connected to the measurement unit 40 by a first wire 42, and the mounting unit 140 or the cell extension terminal 624 is connected to the measurement unit 40 by a second wire 44.

Referring back to FIG. 5, according to an exemplary embodiment of the present disclosure, a holder unit 80 is further provided. The holder unit 80 supports the cell 10 placed on the mounting unit 140 during the inspection performed by the present system. In an exemplary embodiment, the holder unit 80 is configured to be movable upwards and downwards. The holder unit 80 descends after the cell 10 is inserted into the mounting unit 140 to press the cell 10 with a certain force. The certain force is a force pressing the cell 10 to be rotatable, and a magnitude of the force may be preset. In an exemplary embodiment, the holder unit 80 is supported by the base 4. In another embodiment, the holder unit 80 is supported by the contact unit 20.

An operation of the system according to the present disclosure will be described with reference to FIGS. 12A to 12H.

Figure 12A:
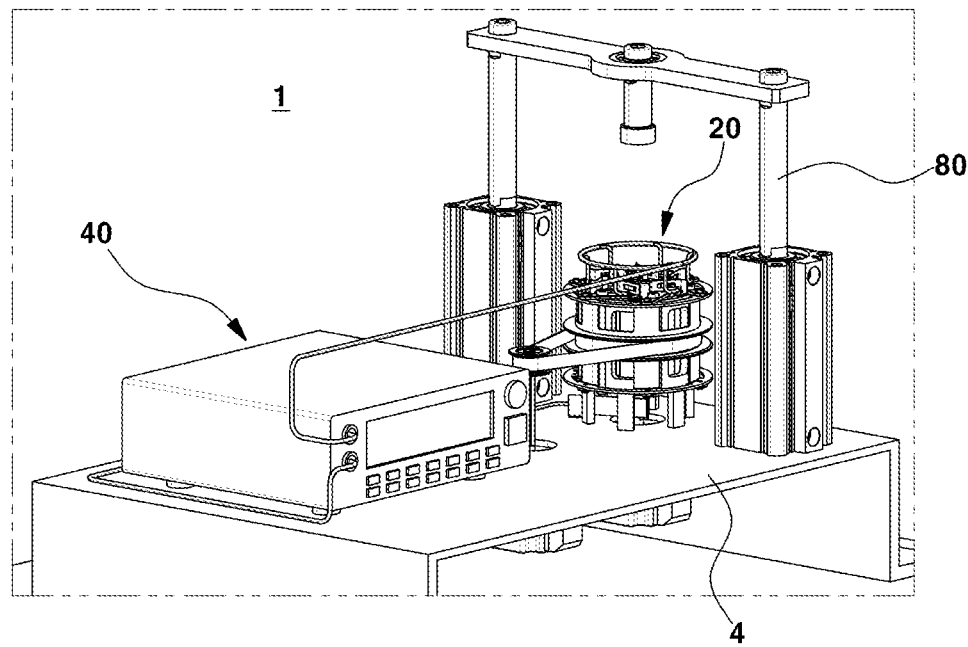
FIGS. 12A to 12H show an inspection process of the cell insulation defect detection system according to the present disclosure.
Figure 12B:
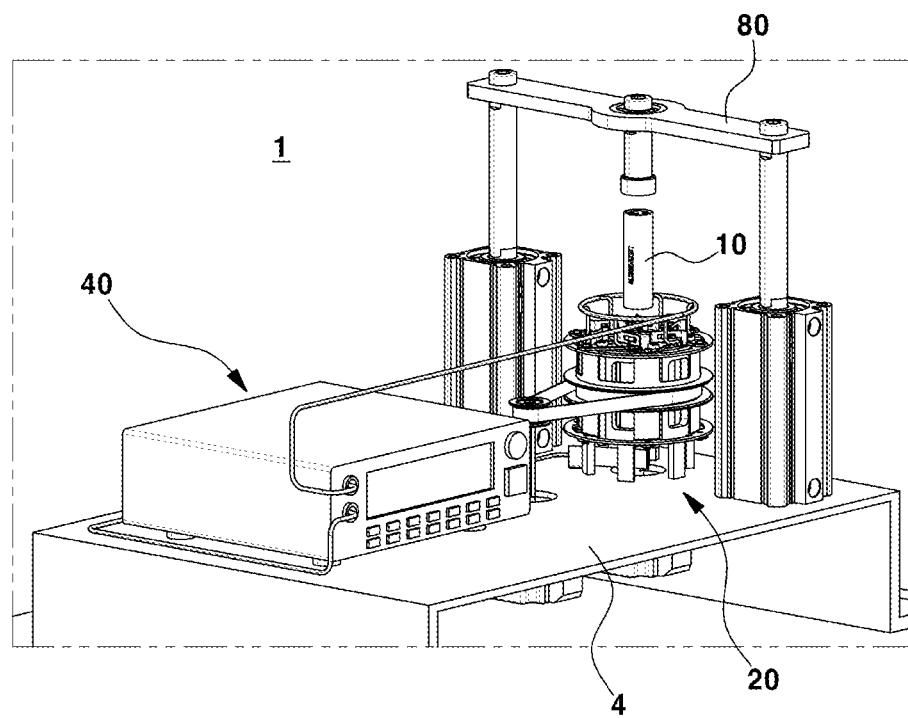
Figure 12C:
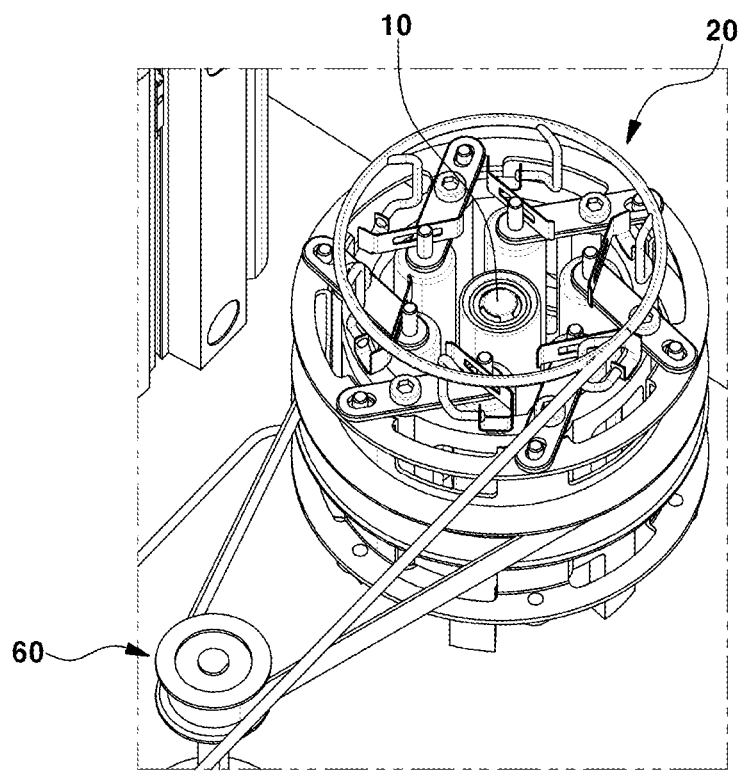
Figure 12D:
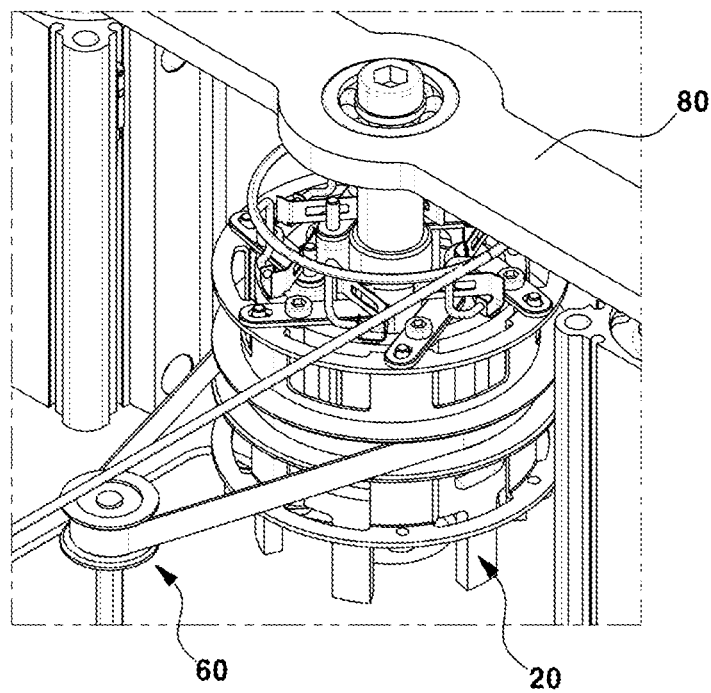
Figure 12E:
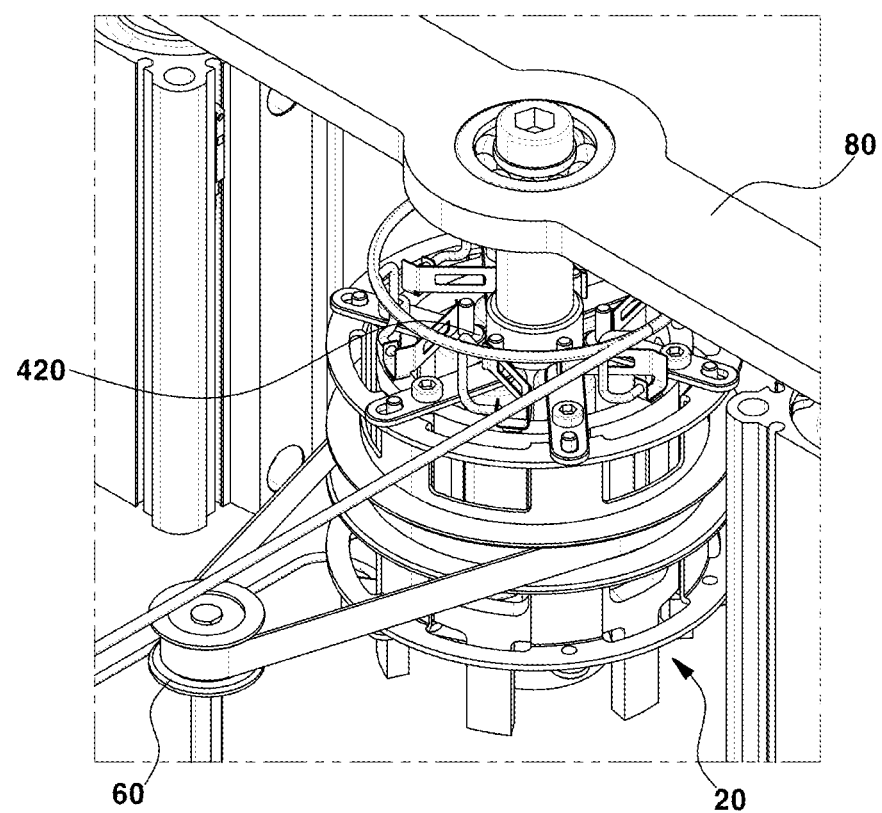
Figure 12F:
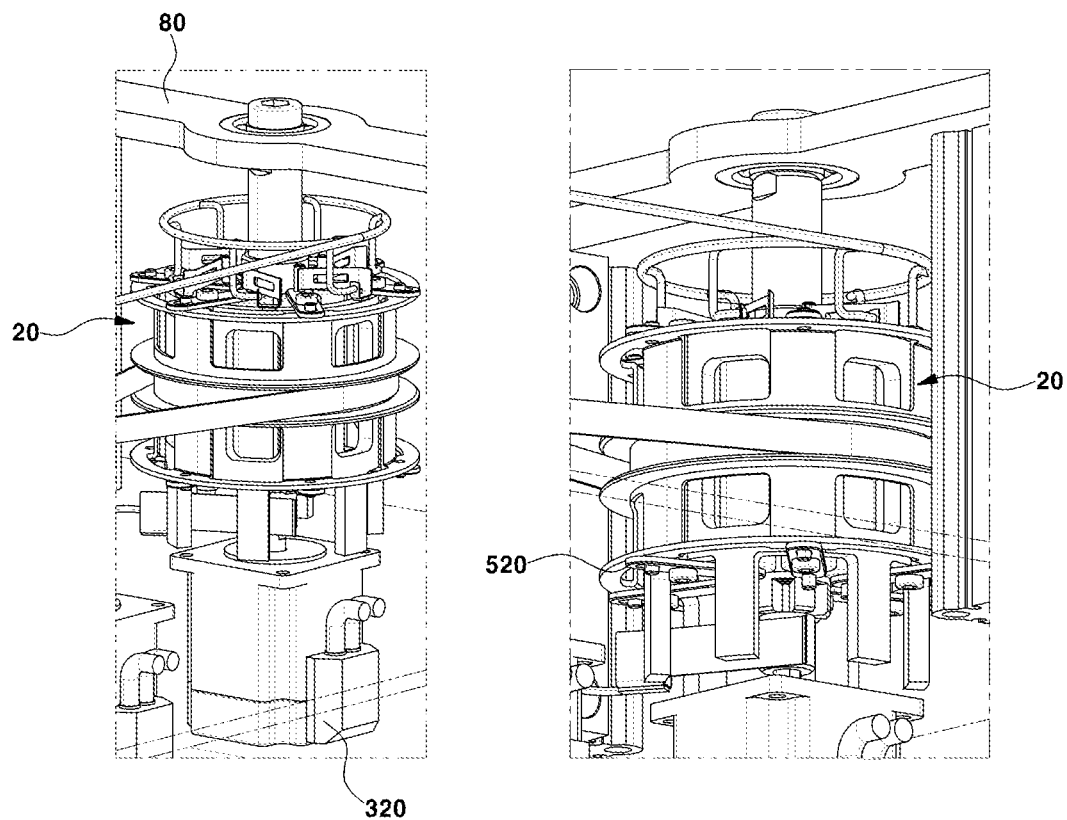
Figure 12G:
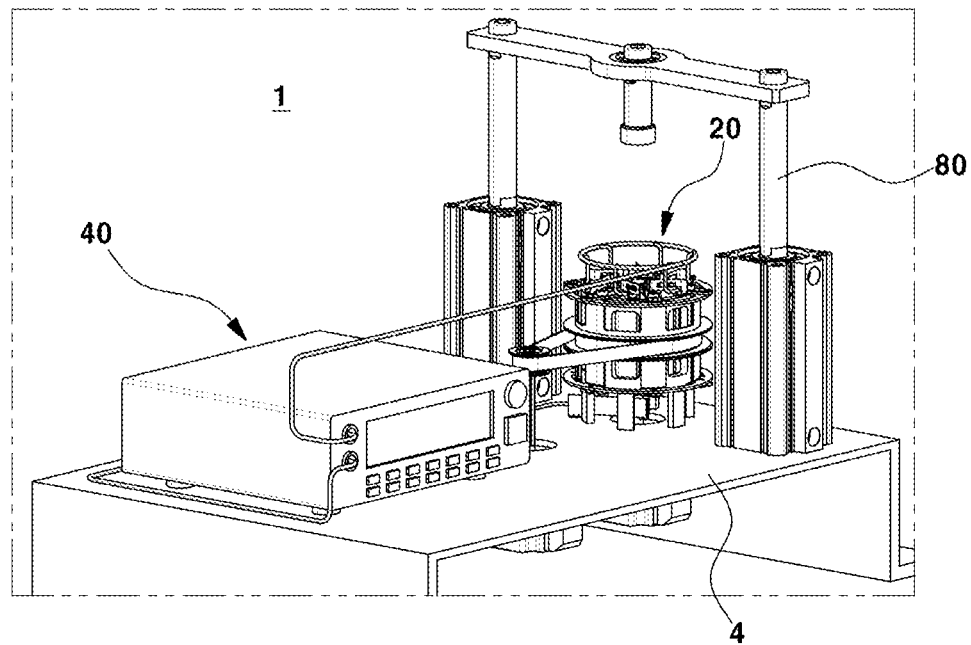
Figure 12H:
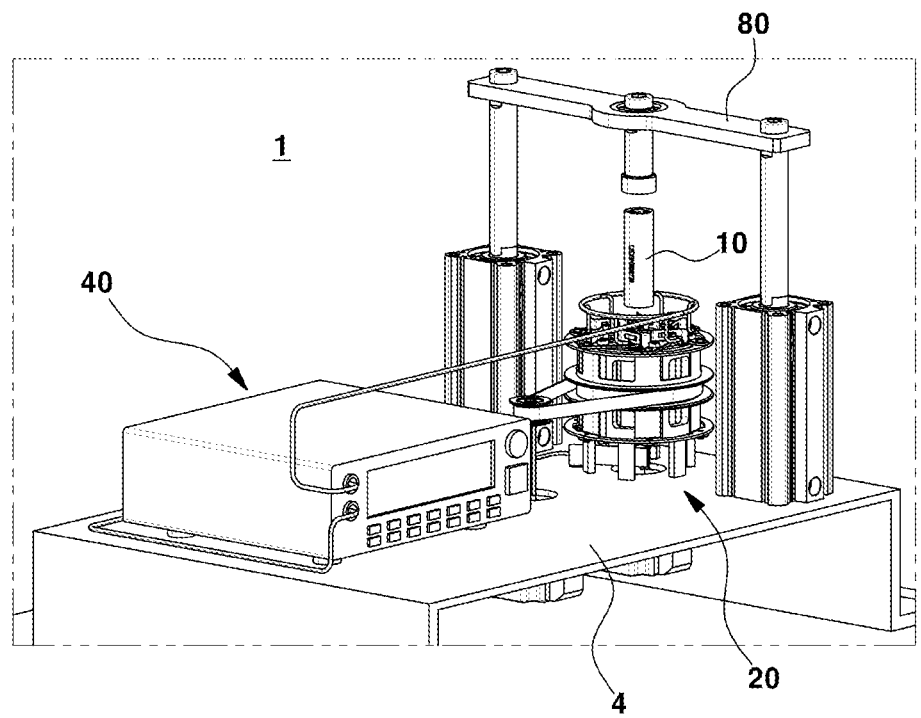
Figure 13:
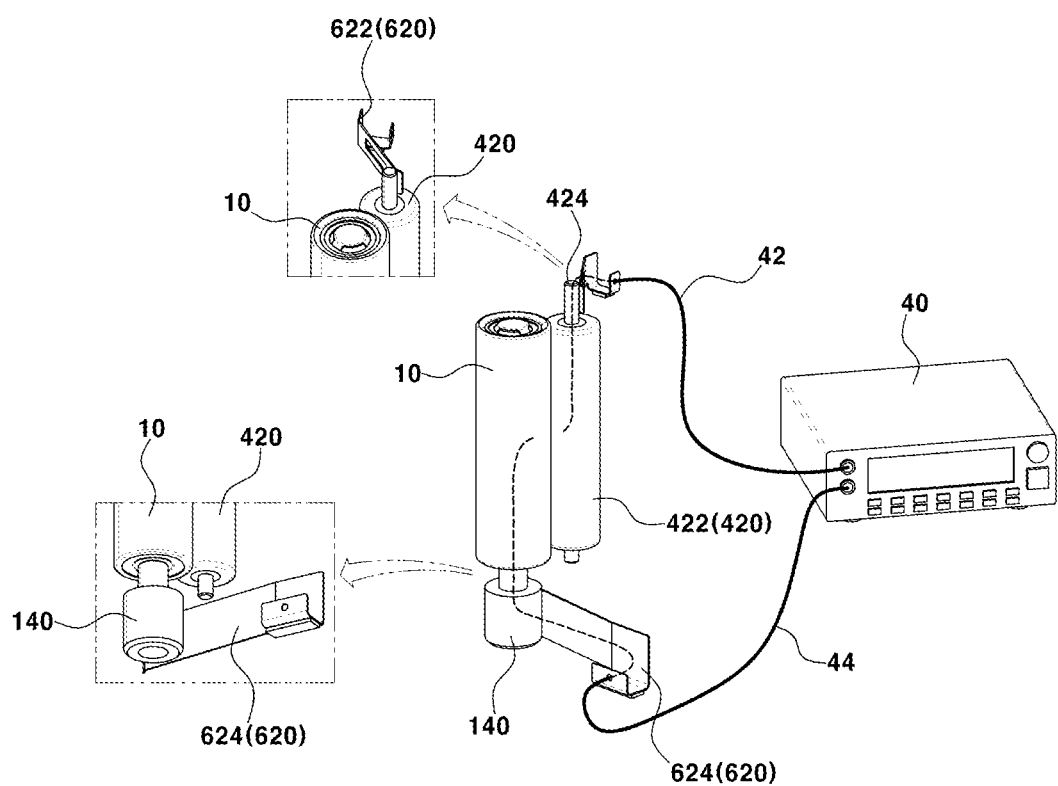
FIGS. 13 and 14 show a method of identifying a defective cell from a normal cell during the insulation test performed according to the present disclosure.
Figure 14:
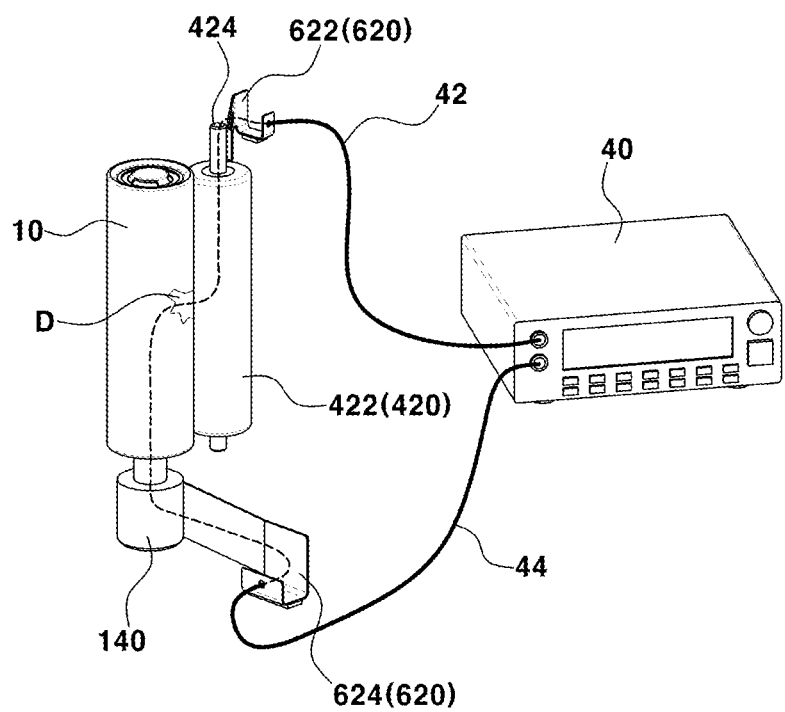

As shown in FIG. 12A, the cell insulation defect detection system 1 according to the present disclosure is in a standby state. For inspection, the cell 10 is inserted into the mounting unit 140 from above the contact unit 20 as shown in FIG. 12B. When the cell 10 is inserted thereinto, arrangement as shown in FIG. 12C is achieved. In this case, the roller 420 is positioned adjacent to an inner circumferential surface of the fixed frame 120, and the link 520 is disposed not in the radial direction of the contact unit 20 but at an angle relative to the radial direction thereof. Next, when the cell 10 is completely mounted in the mounting unit 140, the holder unit 80 descends to press an upper portion of the cell 10 (FIG. 12D). When the cell 10 is pressed by the holder unit 80, the rotation unit 60 is rotated. For example, the rotation unit 60 is rotated counterclockwise so that the rotation frame 220 is also rotated counterclockwise. When the rotation frame 220 rotates, the link 520 connected to the rotation frame 220 also rotates with respect to the pivot part 524. Then the link 520 is aligned with the radial direction of the contact unit 20 as shown in FIG. 12E (refer to an arrow in FIG. 9). Put differently, all the links 520 are oriented toward the cell 10. As the link 520 is aligned with the radial direction of the contact unit 20, the roller 420 connected to the inner connection part 526 moves radially inward. Accordingly, at the present position, the roller 420 moves further away from the fixed frame 120 and comes into close contact with the cell 10 mounted in the mounting unit 140. Here, the respective roller 420 in close contact with the cell 10 maintains a predetermined distance from each other. As described above, in the state in which the roller 420 is in contact with the cell 10, the mounting unit motor 320 is driven to rotate the mounting unit 140. The cell 10 is rotated by the rotation of the mounting unit 140, and insulation resistance measurement of the cell 10 starts (FIG. 12F). While the cell 10 rotates, the cell 10 is checked whether the tubing 12 is damaged. As shown in FIGS. 13 and 14, the insulation resistance test may be determined based on a measurement value of the measurement unit 40. FIG. 13 shows a case of the non-defective cell 10, and FIG. 14 shows a case of the defective cell 10. When there is no defect in the tubing 12 of the cell 10, the cell 10 and the roller 420 are insulated from each other even when the conductive roller 420 and the cell 10 are in contact with each other (a dotted line in FIG. 13 indicates an insulation state), and a measured resistance value becomes a large value. For example, when the insulation of the cell 10 is normal, about 100 megaohms may be measured. On the other hand, as in case of FIG. 14, when there is a damaged portion D on the tubing 12 of the cell 10, the cell 10 and the roller 420 are electrically connected to each other through the damaged portion D, and a resistance value much smaller than that of the case of FIG. 13 is measured. For example, when the insulation is broken, about 10 milliohms may be measured. When the inspection is performed in this manner and completed, the holder unit 80 is moved upwards as shown in FIG. 12G and the cell 10 is removed from the contact unit 20 (FIG. 12H).

According to the present disclosure, insulation defects of individual cells can be detected prior to assembly of a battery module, thereby reducing costs and improving reliability.

As is apparent from the above description, the present disclosure provides a cell insulation defect detection system capable of detecting insulation defects of individual cells in advance.

The effect of the present disclosure is not limited to the above-mentioned effect, and other effects not mentioned will be clearly understood by those skilled in the art from detailed descriptions in the embodiments.

The disclosure has been described in detail with reference to preferred embodiments thereof. However, it will be appreciated by those skilled in the art that changes may be made in these embodiments without departing from the principles and spirit of the disclosure, the scope of which is defined in the appended claims and their equivalents.

What is claimed is:

1. A cell insulation defect detection system, comprising:
    a contact unit comprising:
        a conductive roller configured to contact a battery cell to be inspected, wherein the contact unit is configured to rotatably position the battery cell in the contact unit;
        a fixed frame; and
        a link rotatably mounted on the fixed frame, wherein the roller is connected to a first side of the link; and
    a measurement unit configured to measure insulation resistance between the roller and the cell in contact with each other.

2. The cell insulation defect detection system of claim 1, wherein the roller is configured to be movable at a predetermined distance in the contact unit so as to cause the roller to:
    contact the cell; or cease the contact with the cell.

3. The cell insulation defect detection system of claim 1, wherein the contact unit further comprises a rotation frame rotatably mounted at an outside of the fixed frame and connected to a second side of the link.

4. The cell insulation defect detection system of claim 3, further comprising a rotation unit configured to provide rotational force to the rotation frame.

5. The cell insulation defect detection system of claim 4, further comprising:
    a rotation unit motor configured to provide a driving force to the rotation unit; and
    a belt surrounding the rotation unit and the rotation frame.

6. The cell insulation defect detection system of claim 1, wherein the contact unit further comprises:
    a mounting unit configured to house the cell to be rotatable therein, and
    a mounting motor configured to provide rotational force to the mounting unit.

7. The cell insulation defect detection system of claim 6, wherein:
    the roller comprises roller terminals provided on opposite sides of the roller in a longitudinal direction of the roller, and
    the measurement unit is connected to any one of the roller terminals and to the mounting unit.

8. The cell insulation defect detection system of claim 7, wherein the roller terminal extends toward an outside of the contact unit.

9. The cell insulation defect detection system of claim 7, wherein the mounting unit comprises a cell extension terminal extending toward an outside of the contact unit.

10. The cell insulation defect detection system of claim 1, further comprising a holder unit configured to press the cell, disposed in the contact unit, with a preset force.

11. A cell insulation defect detection system, comprising:
    a contact unit comprising a conductive roller configured to contact a battery cell to be inspected, wherein the contact unit is configured to rotatably position the battery cell in the contact unit; and
    a measurement unit configured to measure insulation resistance between the roller and the cell in contact with each other;
    wherein the contact unit further comprises:
        a fixed frame;
        a plurality of links spaced apart from each other at a predetermined distance along a circumference of the fixed frame and coupled to the fixed frame, each of the plurality of links being rotatable around a pivot part configured to couple the plurality of links to the fixed frame;
        a plurality of conductive rollers disposed to be spaced apart from each other at a predetermined distance along an inner circumference of the fixed frame, each of the rollers being connected to an inner connection part of each link; and
        a rotation frame rotatably disposed at an outside of the fixed frame and connected to an outer connection part of each link, the rotation frame configured to be rotatable.

12. The cell insulation defect detection system of claim 11, further comprising a rotation unit configured to rotate the rotation frame.

13. The cell insulation defect detection system of claim 11, wherein pin members are disposed a certain distance apart from each other along a circumference of the rotation frame, wherein each outer connection part of the link is inserted into a respective pin member of the pin members.

14. The cell insulation defect detection system of claim 13, wherein a size of a cross-section of the pin member is smaller than a size of a cross-section of the outer connection part.

15. The cell insulation defect detection system of claim 11, wherein the cell is disposed to be surrounded by the plurality of rollers.

16. The cell insulation defect detection system of claim 15, wherein:
    the link comprises:
    a measurement position aligned toward the cell; and
    a preparation position disposed at an angle relative to the measurement position, and
        the link is configured to rotate between the measurement position and the preparation position.

17. A cell insulation defect detection system, comprising:
    a contact unit comprising a conductive roller configured to contact a betery cell to be inspected, wherein the contact unit is configured to rotatably position the battery cell in the contact unit to rotate the battery cell about an axial direction of the battery cell; and
    a measurement unit configured to measure insulation resistance between the roller and the cell in contact with each other.

* * * * *